United States Patent [19]
Haight et al.

[11] Patent Number: 5,714,838
[45] Date of Patent: Feb. 3, 1998

[54] OPTICALLY TRANSPARENT DIFFUSION BARRIER AND TOP ELECTRODE IN ORGANIC LIGHT EMITTING DIODE STRUCTURES

[75] Inventors: Richard Alan Haight, Mahopac, N.Y.; Ronald Roy Troutman, Ridgefield, Conn.

[73] Assignee: International Business Machines Corporation, Armonk, N.Y.

[21] Appl. No.: 716,901

[22] Filed: Sep. 20, 1996

[51] Int. Cl.⁶ .................................................. H01J 1/62
[52] U.S. Cl. ................................... 313/506; 313/504
[58] Field of Search ............................... 313/504, 505, 313/506, 509, 498

[56] References Cited

U.S. PATENT DOCUMENTS 5,616,427  4/1997  Tada ............................. 313/506

Primary Examiner—Ashok Patel
Assistant Examiner—Vip Patel
Attorney, Agent, or Firm—Stephen S. Strunck

[57] ABSTRACT

In the formation of organic light emitting diodes with a transparent top electrode, it was discovered that many of the materials used for this electrode can readily diffuse at room temperature into the organic films, creating shorts and otherwise compromising the performance of the diode. A solution to this problem is disclosed which involves a method for the creation of a diffusion barrier which prevents diffusion of electrode materials into the substrate while enhancing the ability of the OLED to emit light through the top electrode.

18 Claims, 6 Drawing Sheets

OPTICALLY TRANSPARENT DIFFUSION BARRIER AND TOP ELECTRODE IN ORGANIC LIGHT EMITTING DIODE STRUCTURES

FIELD OF THE INVENTION

The general field of this invention is that of organic electroluminescent diodes. In particular, the diode described herein has a transparent top electrode. The invention described herein provides a structure for protecting the organic luminescent material from damage and in-diffusion of subsequently deposited electrode materials while maintaining good optical, electron injecting and adhesive properties.

BACKGROUND OF THE INVENTION

Organic electroluminescent materials are being aggressively pursued as candidates for use as active media in emissive monochrome and full color displays. Although anthracene was shown many years ago to possess electroluminescent properties, the high voltages required to drive organic light emitting diodes using this material rendered it an unattractive medium for use in displays. In 1987 Tang and co-workers published, in Applied Physics Letters, vol. 51, page 913 (21 Sept. 1987) an article entitled "Organic EL Diodes", which is herein incorporated by reference, about the first relatively efficient organic light emitting diode (OLED) structure which exhibited turn-on voltages of below 10 V. The structure involved the vacuum deposition of a series of organic layers including a hole injecting/adhesion layer, a hole transporting layer, typically a diamine, and an emissive layer of tris(8-hydroxy)-quinoline Al (Alq3). These layers are deposited onto a glass substrate coated with a conductive film of Sn doped indium oxide (ITO). The ITO is used as a transparent anode. The cathode, which can be formed from a wide range of metals as disclosed in U.S. Pat. Nos. 4,720,432 and 4,539,507, the disclosures of which are incorporated herein by reference, is deposited on top of the organic multilayer stack. The most widely used cathode material is Mg metal doped with a small percentage of Ag. The low work function of Mg enhances electron injection and hence efficiency of the device.

More complicated cathode structures have been proposed that also include protection against black spot formation, which is a degradation of the interface between the cathode and electron transport layer and is believed to be caused by ambient moisture. Such structures are disclosed in U.S. Pat. Nos. 5,047,687 and 5,059,861, the disclosures of which are incorporated herein by reference. These cathode structures include some form of a reactive metal overlying the regular cathode whose role it is to oxidize and prevent moisture from reaching the interface under the cathode.

The cathode materials discussed above are not optically transparent and light can only be emitted through the ITO/glass substrate. Complications arise when the organic stack is deposited upon an opaque substrate such as Si. Deposition on Si substrates or Si based circuitry would be a desirable approach for integrating a monochrome or full color display possessing a high density of OLEDs. In such an arrangement, light would then be required to pass through the top electrode. Thus, instead of a thick metal layer as the top electrode, a transparent electrode would be required.

A partially transparent cathode using a thin (5–10 nm) MgAg film with an Alq3 emissive layer has been reported by Bulovic et al., in Nature, vol. 380, page 29 (7 Mar. 1996), which article is incorporated herein by reference. However, the subsequent ITO sputtering step oxidizes a portion of this film. Electrical shorts between the anode and cathode result if there is no residual un-oxidized MgAg and the transparency is variable and poorly controlled if there is residual metal. What is needed is a more consistent and better controlled transparent top electrode.

SUMMARY OF THE INVENTION

The invention herein provides a novel approach to solving the serious problem of diffusion of the evaporated electrode material into the organic film which arises during the formation of organic light emitting diodes (OLEDs) with top transparent electrodes. It has been discovered that the use of appropriately thin layers of Ca metal deposited on top of the organic films forms an effective diffusion barrier. In addition, Ca has a low work function for good electron injection, is among the most optically transparent metals, reacts well with the organic film leading to good adhesion and is easily sublimed at relatively low temperatures. It has further been discovered that Ca, like Mg and Li, can be alloyed with other metals, e.g. Al and/or Ga, to increase stability without compromising device performance. This Ca-based electron injecting layer comprises a homogeneous Ca alloy, a graded Ca alloy, or various Ca and Ca alloy layer sequences. In addition, when a thin Ca-based injection layer is combined with a wide-bandgap semiconductor over-layer, a relatively transparent cathode for OLEDs can be formed. The electrode can be made especially transparent if some of the Ca and/or Ca alloy layer is consumed by or reacts during the deposition of the wide-bandgap semiconductor. Such transparent electrodes are desirable, in fact required, for devices fabricated on opaque substrates such as Si.

BRIEF DESCRIPTION OF THE DRAWINGS

The invention will be more fully understood and further advantages will become apparent when reference is made to the following detailed description of the preferred embodiments of the invention and the accompanying drawings in which.

DETAILED DESCRIPTION OF THE INVENTION

Figure 1:
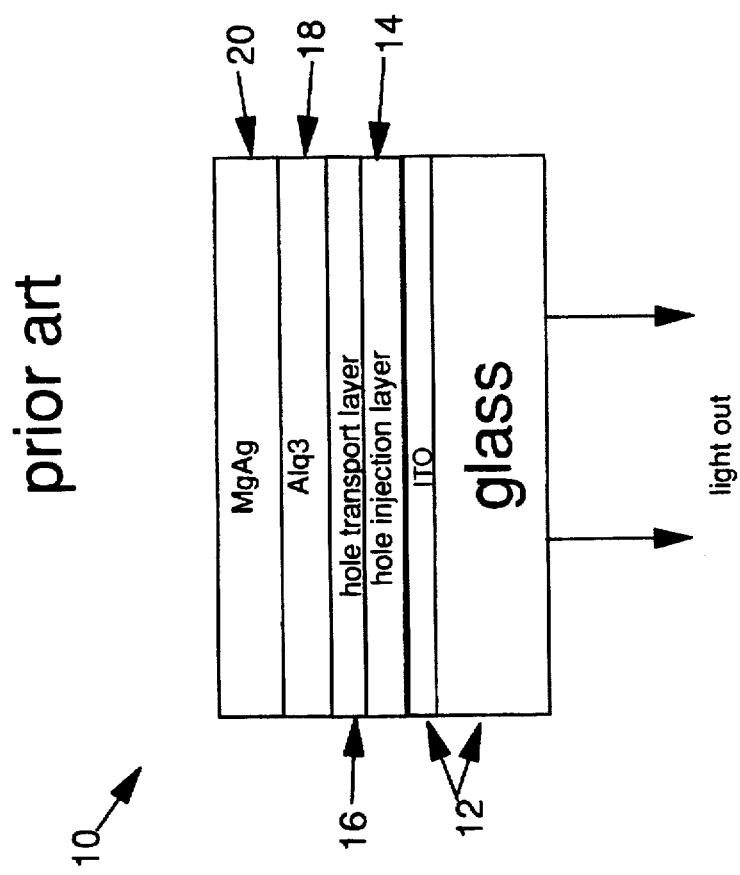
FIG. 1 shows an OLED device of the prior art wherein an electrode pattern of ITO is deposited on glass, and the light from the OLED emerges through the ITO/glass substrate.

FIG. 1 shows an OLED device of the prior art, 10, wherein an electrode pattern of indiumtin oxide (ITO) is deposited on glass substrate 12. An organic stack consisting of 125 Å CuPc, 14, 600 Å of a diamine, 16, and 650 Å Alq3, 18 is deposited. Finally, the top surface of the Alq3 is covered with a 1500 Å layer of MgAg, 20. The light from the OLED emerges through the ITO/glass substrate, 12.

Figure 2:
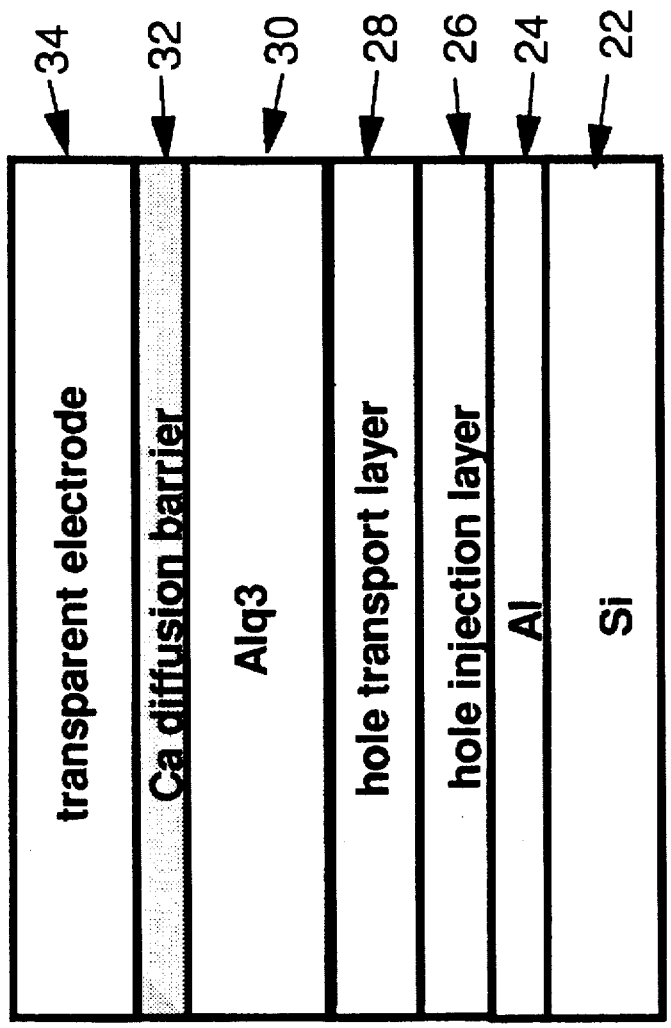
FIG. 2 shows an embodiment of the invention wherein an OLED is fabricated on top of an opaque substrate such as Si based circuitry.

FIG. 2 shows an embodiment of the invention for an OLED fabricated on top of an opaque substrate such as Si based circuitry. A bottom layer of ITO or Al, 24 is deposited on Si substrate, 22, followed by 125 Å CuPc, 26, 600 Å of a diamine, 28, and 650 Å Alq3, 30. A thin layer of Ca, 32, is deposited upon the Alq3 film 30 which acts as a diffusion barrier. Subsequent depositions of transparent cathode materials, 34 follow which might be ZnS, GaN, ITO or ZnSe, or combinations of these materials.

Figure 3:
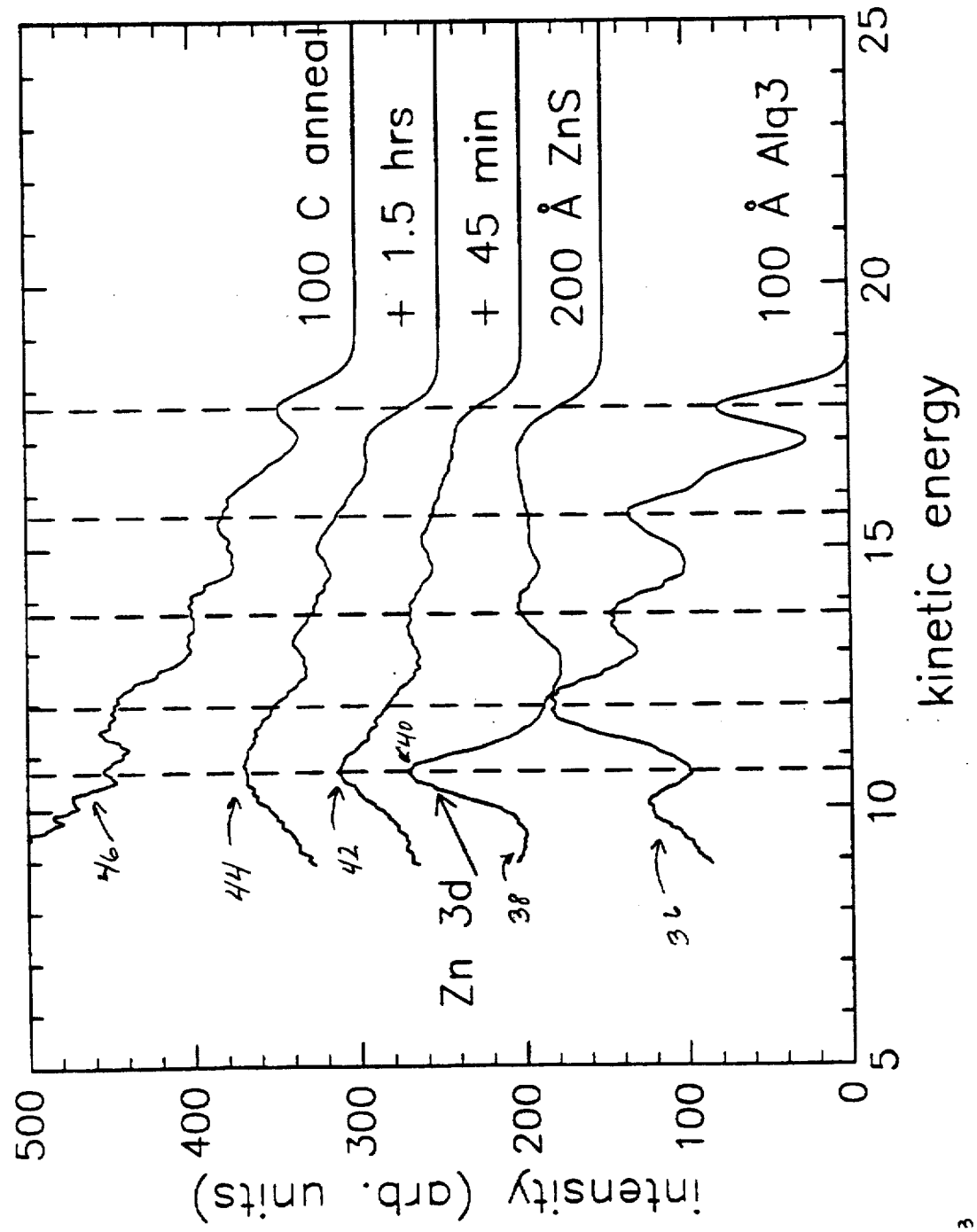
FIG. 3 shows a series of photoelectron spectra collected from a 100 Å film of Alq3 deposited on a conductive substrate and after 200 Å of ZnS was deposited on the Alq3.

One possible transparent top electrode is ITO, as described earlier. Other candidates are wide band gap degenerately doped or highly doped semiconductors such as GaN, ZnS, ZnSe. During depositions of ZnS, it was discovered that vacuum deposited ZnS rapidly diffused into the top layer of Alq3. FIG. 3 shows a series of photoelectron spectra in which 200 Å of ZnS was deposited onto a 100 Å thick film of Alq3. In FIG. 3, the Zn 3d atomic core level was monitored with ultraviolet photoelectron spectroscopy as a function of time after deposition of the ZnS. The bottom spectrum (36) was collected from a 100 Å film of Alq3 deposited on a conductive substrate. The next spectrum from the bottom (38) was collected after 200 Å of ZnS was deposited on the Alq3. The Zn 3d core level (40) is clearly seen. After 45 minutes, the Zn core level (42) has diminished in intensity significantly and by 1.5 hours, the same core level signal (44) is nearly gone, indicating that the ZnS has diffused into the Alq3 film. The top spectrum (46) shows a spectrum after the sample was annealed to 100° C., a temperature close to what may be experienced by the organic materials during OLED fabrication. It is noted that the Zn core level has completely vanished and features associated with the molecular levels of Alq3 have reappeared.

Figure 4:
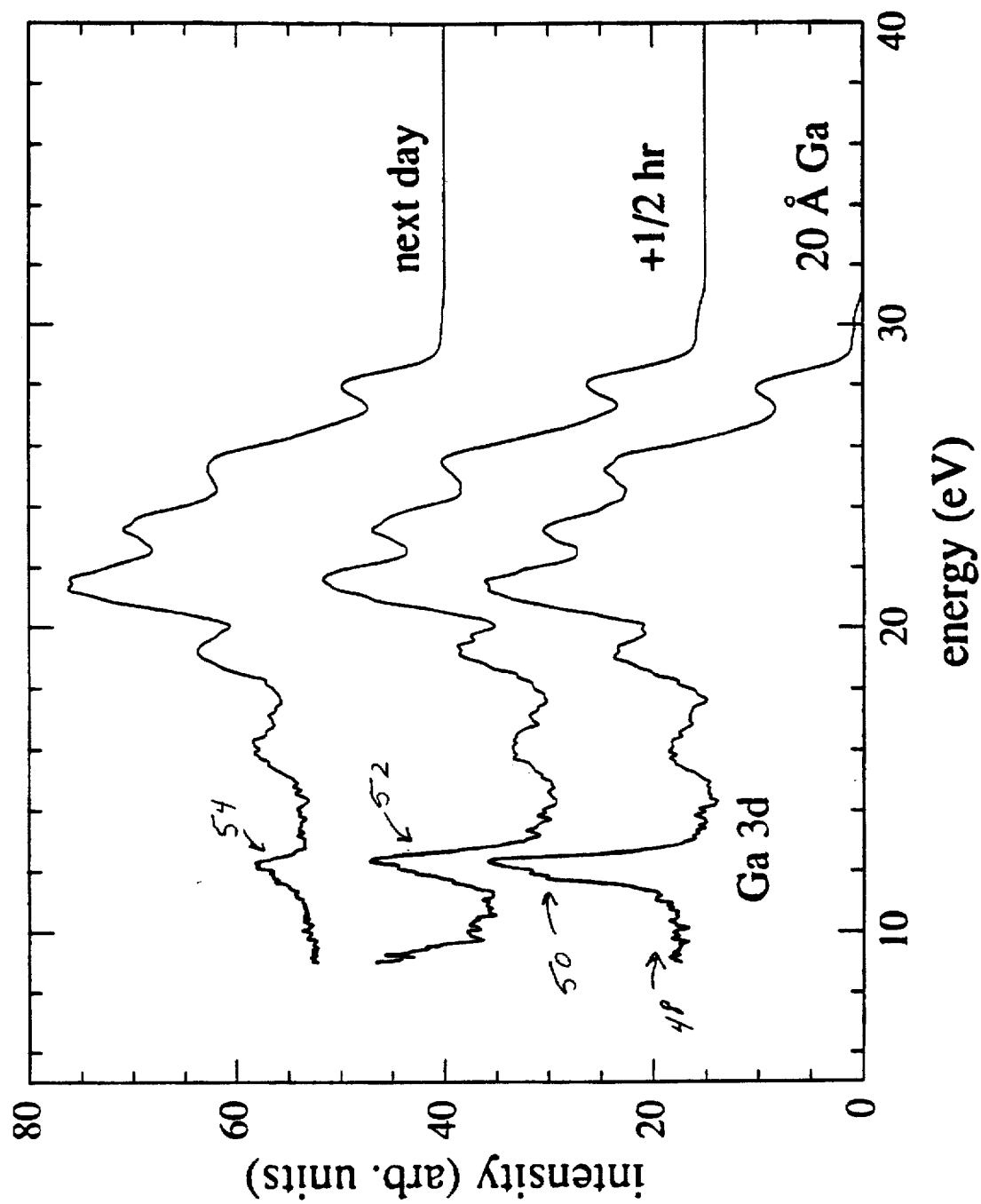
FIG. 4 shows a similar series of spectra to those of FIG. 4 for Ga deposited on Alq3.

Further experiments were carried out by depositing Ga onto Alq3 as shown in FIG. 4. The series of spectra show that the Ga forms islands on top of the Alq3 without chemically reacting and then diffuses into the Alq3. The diffusion can be observed as a loss of intensity of the Ga 3d atomic core level intensity. In FIG. 4, the bottom spectrum, (48), is that from the Alq3 layer. In this case the Ga forms islands or balls up, leaving exposed patches of Alq3. Visible is the Ga 3d core level (50). After a series of time delays of ½ hour and 24 hours, the Ga core level signals (52), (54) disappear indicating the Ga has diffused into the interior of the Alq3.

These experiments are representative of a series of measurements which indicate that materials which are deposited onto Alq3, which do not chemically react with the Alq3, will rapidly diffuse into the organic film. Experiments on other organic films such as copper pthalocyanine (CuPc), exhibit the same behavior. Diffusion of metals and semiconducting materials into electroluminescent organic films have deleterious effects such as quenching of luminescence, electrical shorting which renders the OLED inactive, and reduction of operating lifetime.

As described herein, a novel solution to this important problem is presented. This solution involves the deposition of an appropriately thin layer of Ca metal onto the organic film prior to deposition of the transparent electrode material. We have discovered that the deposition of a thin layer of Ca metal results in a reacted Ca/organic interface which is then completely stable against diffusion of subsequently deposited electrode materials. Our experiments have shown that the first 10–15 Å of deposited Ca fully reacts with the topmost layer of the organic film. Further deposition of Ca results in increasingly thick layers of unreacted Ca metal.

Figure 5:
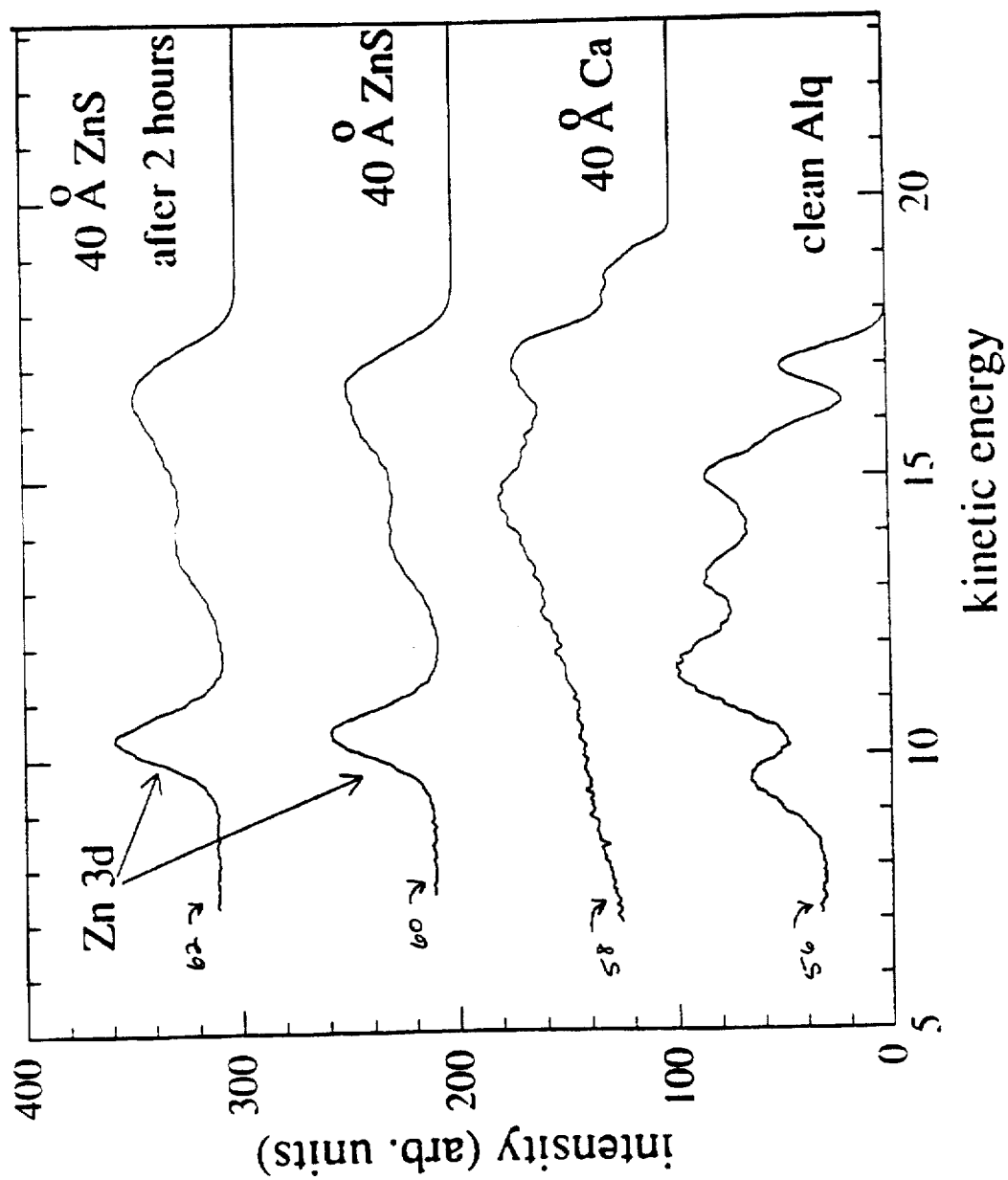
FIG. 5 shows a series of photoelectron spectra starting from a film of Alq3 followed by 40 Å of Ca as an interlayer, followed by 40 Å of ZnS collected 2 hours after deposition.

More particularly, FIG. 5 shows a series of spectra starting from a film of Alq3, (56) followed by 40 Å of Ca as an interlayer, (58). This is followed by 40 Å of ZnS (60). The top spectrum (62) is collected after waiting 2 hours. No difference in the spectrum is observed indicating that the Ca has formed an effective diffusion barrier preventing the ZnS from penetrating the Alq3.

Figure 6:
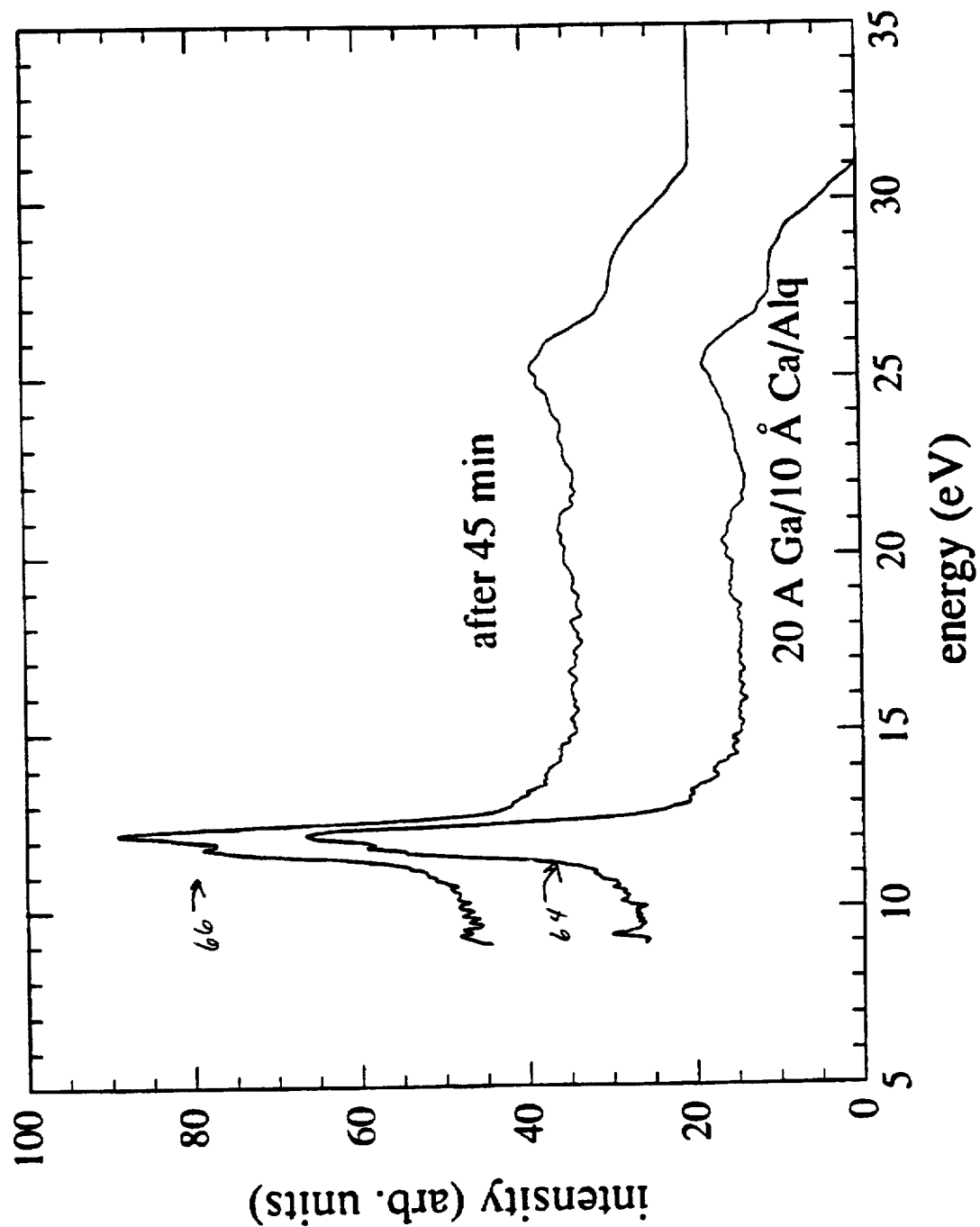
FIG. 6 shows a series of photoelectron spectra collected from an Alq3 layer which was covered with 10 Å Ca and then 20 Å Ga at varying time intervals after deposition of these layers.

FIG. 6 shows a spectrum collected from an Alq3 layer which is covered with 10 Å Ca and then 20 Å Ga just after deposition of these layers. Ga core level signal, (64) is compared with Ga core level signal (66) after waiting 45 minutes. No change in signal (66) with respect to signal (64) is observed again indicating that the Ca has produced an effective diffusion barrier.

Ca possesses a number of attractive properties. Ca is highly reactive so that when deposited on top of the organic film it reacts rather than diffuses into the film. Ca has a low work function which makes it attractive as an efficient injector of electrons into the organic. Ca, as a metal is one of the most optically transparent in the visible range where the OLED operates. We have shown experimentally that 10–15 Å is the minimum thickness required in order to prevent ZnS or Ga from diffusing into Alq3. Ca is easily evaporable and sublimes at relatively low temperatures. This indicates that the evaporation source can be relatively close to the organic film without heating the film to temperatures beyond that where the organic crystallizes since crystallization renders the OLED inoperable. Finally, a reacted Ca layer will also serve as an effective adhesion layer between the organic film and subsequently deposited transparent electrode material.

Most importantly, we have discovered that Ca is an effective diffusion barrier to subsequently deposited electrode materials.

While the invention has been described with respect to preferred embodiments thereof, it will be appreciated by those having skill in the art that variations may be made in the invention without departing from the spirit and scope of the invention.

Having thus described our invention what we claim as new and desire to secure as Letters Patent, is:

1. Organic light emitting device having
    a) a substrate,
    b) two contact electrodes, one thereof serving as an anode and the other serving as a cathode,
    c) an organic region situated between said two contact electrodes in which electroluminescence takes place if a voltage is applied between said two electrodes, and
    d) a barrier layer between said organic region and at least one of said contact electrodes.

2. The device of claim 1 in which the material of said contact electrode in contact with said barrier layer consists of an organic film.

3. The structure of claim 1 in which the material of said contact electrode in contact with said barrier layer consists of an inorganic film.

4. The structure of claim 1 in which the barrier layer consists of a thin layer of a reactive metal selected from the group consisting of Ca, Mg, Sr, Al, and Li.

5. The device of claim 1 wherein one of said contact electrodes is a transparent electrode situated opposite from said substrate and consisting of a thermally evaporated thin metal barrier layer covered by a transparent conductor selected from the group comprising ITO, InO, ZnS, ZnSe, GaN, or combinations thereof.

6. The device of claim 5 in which the transparent top electrode is a cathode and the metal is chosen to have a low work function to enhance electron injection into the organic underlayer.

7. The device of claim 1 in which the barrier layer consists of 10–15 Å of Ca.

8. The device of claim 5 in which the transparent top electrode is an anode and the material of the barrier layer is chosen to have a high work function to enhance hole injection into the organic underlayer.

9. The device of claim 8 in which the barrier layer consists of 10–15 Å of Al, Ti, Cr, or Fe.

10. The device of claim 1 in which the substrate is Si.

11. An organic light emitting device having
   a) a substrate and a
   b) structure forming a transparent top electrode, said structure consisting of a stack of organic layers, the last of which is an organic underlayer, said organic underlayer having thereon a thermally evaporated thin metal film covered by a transparent conductor selected from the group consisting of ITO, InO, ZnS, ZnSe, GaN, or a combination thereof.

12. The device of claim 11 in which the organic underlayer is a molecular organic material selected from the group consisting of Alq3 and CuPC.

13. The device of claim 11 in which the organic underlayer is the polymer poly (p-phenylene vinylene) (PPV).

14. The device of claim 11 in which the transparent top electrode is a cathode and the thin metal barrier film is chosen to have a low work function to enhance electron injection into the organic underlayer.

15. The device of claim 14 in which the metal film consists of 10–15 Å of Ca.

16. The device of claim 11 in which the transparent top electrode is a anode and the metal is chosen to have a high work function to enhance hole injection into the organic underlayer.

17. The device of claim 16 in which the metal film consists of 10–15 Å of Al, Ti, Cr, or Fe.

18. The device of claim 11 in which the substrate is Si.

* * * * *